United States Patent
Barnes

(10) Patent No.: US 6,590,428 B2
(45) Date of Patent: Jul. 8, 2003

(54) EVALUATION OF CONDUCTION AT PRECHARGED NODE

(75) Inventor: William Bryan Barnes, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 10/085,987

(22) Filed: Feb. 27, 2002

(65) Prior Publication Data

US 2002/0131298 A1 Sep. 19, 2002

(30) Foreign Application Priority Data

Feb. 27, 2001 (EP) .......................................... 01301785

(51) Int. Cl.[7] ............................................... H03K 5/24
(52) U.S. Cl. .............................. 327/65; 327/89; 327/55
(58) Field of Search ........................... 327/50, 437, 55, 327/57, 64, 89, 65

(56) References Cited

U.S. PATENT DOCUMENTS

| | | | | |
|---|---|---|---|---|
| 4,611,130 A | * | 9/1986 | Swanson ..................... | 307/355 |
| 5,936,432 A | | 8/1999 | Oh et al. ..................... | 327/55 |
| 6,147,514 A | | 11/2000 | Shiratake ..................... | 327/55 |
| 6,292,030 B1 | * | 9/2001 | Shih ............................ | 327/55 |

OTHER PUBLICATIONS

Huang, H–Y. et al., "Unbalanced Current Latch Sense Amplifier for Low–Power High–Speed PLD's," in *Proceedings of the IEEE International Symposium on Circuits and Systems*, New York, May 12, 1996, pp. 193–196.

* cited by examiner

*Primary Examiner*—Dinh T. Le
(74) *Attorney, Agent, or Firm*—Lisa K. Jorgenson; Dennis M. de Guzman; Seed IP Law Group PLLC

(57) ABSTRACT

To establish whether a precharged node remains isolated or alternatively is subject to discharge, the conventional circuit allows uncertainty. For a period after evaluation starts, the conventional circuit will give a tentative result that may subsequently turn out to be wrong. During evaluation power is dissipated. A differential offset dynamic comparator and timing circuit are used to evaluate whether the node is being discharged. Because the comparator has an offset, much smaller deviations from the precharge potential can be sensed: because it is dynamic, it does not consume steady state current. The timing circuit permits precise knowledge of when to look at the output: before the timing period has elapsed, the result is known to be invalid.

13 Claims, 2 Drawing Sheets

EVALUATION OF CONDUCTION AT PRECHARGED NODE

BACKGROUND OF THE INVENTION

1. Field of the Invention

The present invention is concerned with determining whether a node which has been charged to a given potential remains at that potential or whether the node is being discharged, and thus exhibits a falling potential.

2. Description of the Related Art

There are a number of applications in which a node is charged or precharged by connection to a potential, typically a power supply potential, and a determination is needed as to whether any path exists that is operative to discharge the node once the connection to the potential is removed. In many situations, a circuit has a first logic value when the node remains isolated and a second logic value when a discharge path exists. Typical applications include so-called "precharge-evaluate logic".

Conventional circuits may give rise to a tentative result that may or may not be correct. For example, if a node is falling slowly in potential from its precharged level, and the node potential is being fed as an input to an inverter, the potential fall may need to be quite a substantial fraction of the precharge potential before the inverter is able to respond to it. Hence for a relatively long period of time—for a slow potential variation—the inverter output remains at its original precharge value and only after its input potential has fallen sufficiently will the output change.

During that time conventional circuits consume power. The tentative result also makes such circuits unsuitable for applications where the output is used asynchronously to enable or otherwise control a later process. To do this, the "disabled state must have an output the same as detecting "discharge" in the active state.

It is possible to avoid effects due to the tentative result either by using a timing circuit to mask the output from later circuitry until the output is known to have a valid result, or by using a clocked comparator with a pseudo-differential reference voltage. The latter is advantageous because it is faster, and so it draws power for a shorter time than does the conventional circuit. However it is also disadvantageous because it needs a reference voltage to be created. A reference circuit is likely to create a quiescent power drain, and also consumes chip area and components.

It is an object of the present invention to at least partly mitigate difficulties of the prior art.

BRIEF SUMMARY OF THE INVENTION

According to one aspect the invention provides a method of determining whether the potential on a node remains constant, the method comprising: providing a differential comparator having a first input connected to said node, a second input connected to a constant potential and an output, wherein said first and second inputs become active at respectively lower and higher potentials, the comparator having a first enabled state in which said output represents the difference between the first and second input potentials and a second disabled state, wherein the comparator has no path for dc currents in said enabled and disabled states; connecting the node to said constant potential whereby said node is precharged, while maintaining the disabled state; disconnecting the node from the precharge potential; and after a time delay, causing said comparator to switch to the enabled state, whereby said output indicates whether the node potential remains constant.

According to a second aspect of the invention there is provided a circuit responsive to deviation of a node from a precharge potential after a precharge supply is disconnected from said node, the circuit comprising: a dynamic comparator having first and second first conductivity differentially connected transistors, the first transistor having a gate connected to the said node and the second having a gate connected to the precharge potential, and wherein the first transistor has a lower threshold voltage than the second; the first and second transistors second and third electrodes, a load circuit being connected between the second electrodes and a positive supply node, the load circuit comprising a pair of cross-coupled second conductivity load transistors, said second conductivity being complementary to the first conductivity; the third electrodes of the first and second transistors being connected to a reference potential via a current source transistor of the first conductivity type.

A preferred but exemplary embodiment of the invention will now be described with reference to the accompanying drawings.

BRIEF DESCRIPTION OF THE SEVERAL VIEWS OF THE DRAWINGS

In the various figures, like reference numerals indicate like parts.

DESCRIPTION OF THE PREFERRED EMBODIMENT

Figure 1:
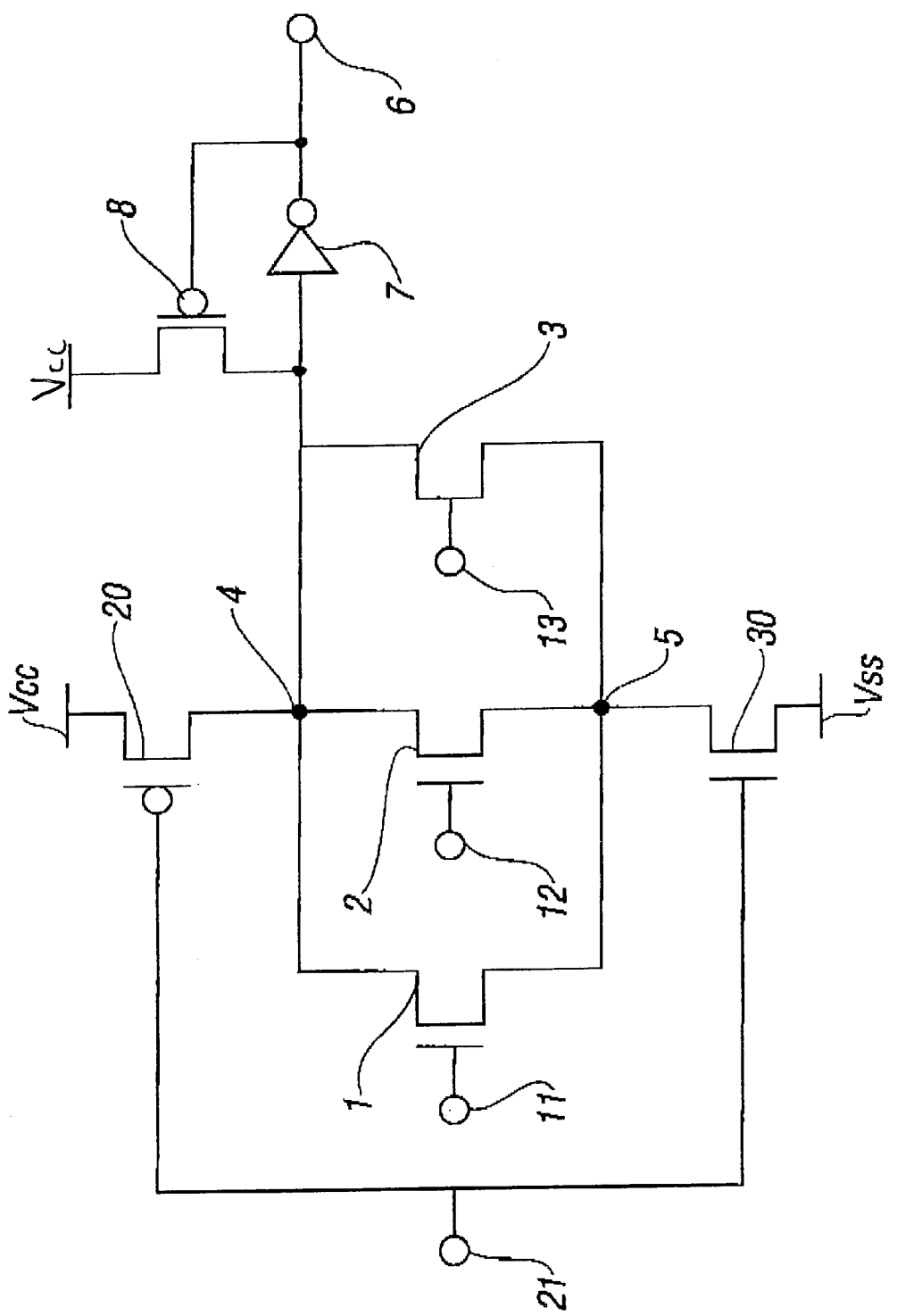
FIG. 1 shows a conventional precharge-evaluate NOR gate using N-type transistors.

Referring to FIG. 1, a precharge-evaluate logic circuit has 3 N-type gate transistors 1, 2, 3 having their drain electrodes connected in common to a precharge node 4 and their source electrode connected in common to a common source node 5.

Each of the gate transistors 1, 2, 3 has a respective gate connection to a logic input connection 11, 12, 13.

The precharge node 4 is connected via a P-type precharge transistor 20 to a positive power supply Vcc and the common source node 5 is connected to a reference potential Vss via an N-type transistor 30. The gate electrodes of the P-type transistor 20 and the N-type transistor 30 are connected in common to a clock node 21. The precharge node 4 is connected to an output terminal 6 via an inverter 7 and the output terminal 6 forms the gate connection of a weak pull-up P-type transistor 8 which is connected between the precharge node 4 and the positive supply Vcc.

In use a clock pulse is provided at the clock terminal 21 and the clock cycle is split into precharge and evaluate phases. When the clock pulse is at logic 0, the P-type transistor 20 conducts and charges the precharge node 4 to substantially Vcc. The N-type transistor 30 is maintained non-conductive. In the logic 1 state of the clock pulse at node 21 the P-type transistor 20 becomes non-conducting and the N-type transistor 30 conducts. If all of the logic inputs 11, 12, and 13 are at logic 0 then all of the logic transistors 1–3 remain non-conducting and the precharge node remains at Vcc. If one or more of the logic inputs 11–13 is at logic 1 then a corresponding number of logic transistors 1–3 conducts and the node 4 discharges via the logic transistors and the N-type transistor 30 to Vss.

When the precharge node 4 is at Vcc, the inverter 7 provides a logic 0 output, and as a result the weak P-type transistor 8 conducts. Clearly the output node 6 is at logic 0. When the clock pulse changes phase and a logic 1 is provided at clock input 21, the inverter 7 serves to evaluate whether or not the precharge node is remaining at the precharge state Vcc or is falling in potential. If one or more of the logic transistors 1–3 conducts then the potential at node 4 will fall as the conductivity of the weak P-type transistor 8 is insufficient to maintain at the node at its high level. When the potential at node 4 falls to around half Vcc the inverter 7 will switch its output so that the weak P-type transistor 8 is turned off and the output node 6 goes to logic 1.

It will be appreciated that there is a DC path in this circuit which allows for power to be dissipated whenever there is conduction through one or more of the logic transistors 1–3, and until the evaluation is complete at which time the weak P-type pull-up transistor 8 ceases to conduct.

It will be seen that the output node 6 remains at the wrong logic state until such time as the precharge node 4 falls to around half Vcc. Therefore, to prevent this tentative logic 0 (which should be a final logic 1) from reaching later components it may be necessary to include a masking arrangement to isolate the node 6 from later components until the latest time at which node 4 could have fallen to half Vcc.

Figure 2:
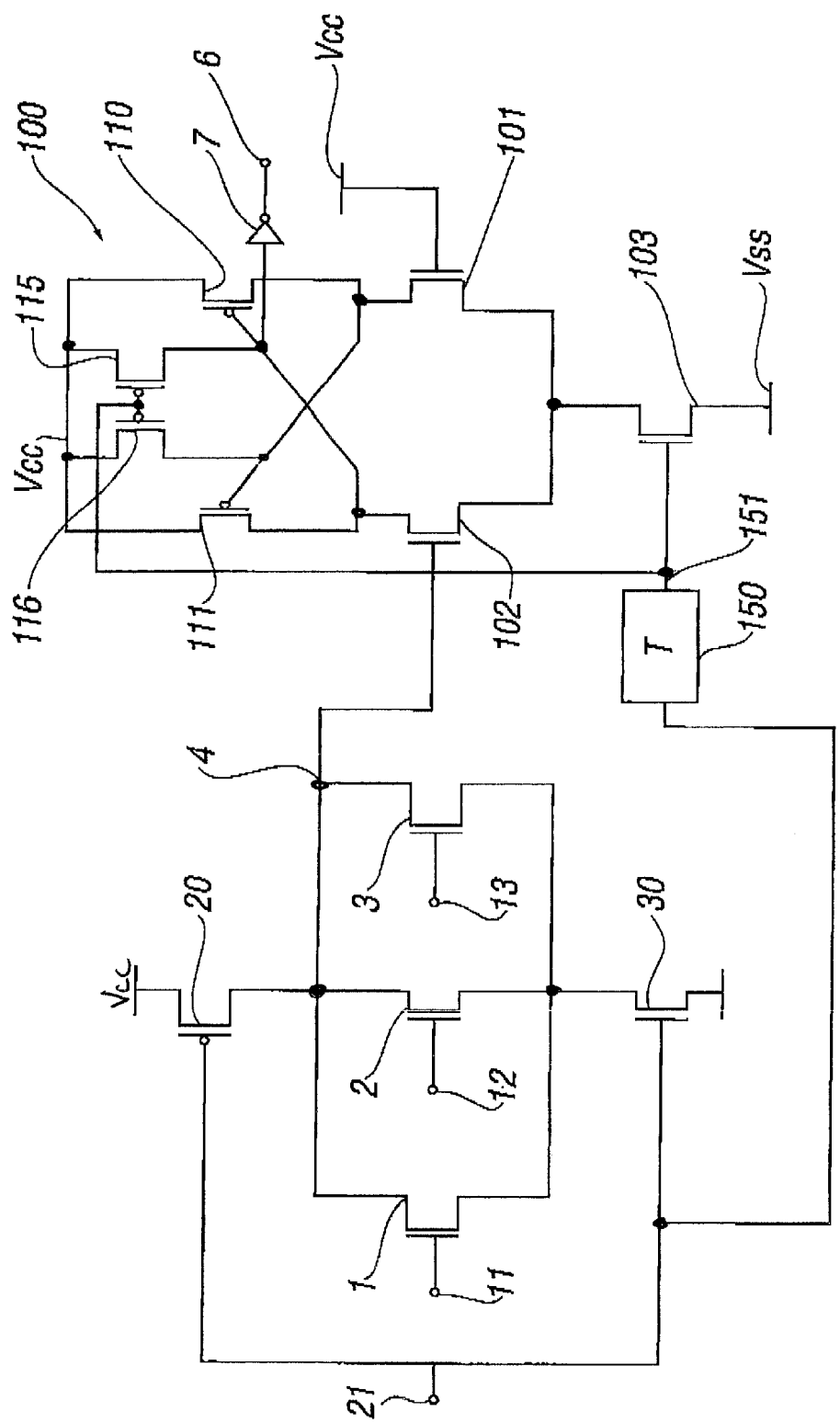
FIG. 2 shows an evaluation circuit responsive deviation of a precharge node in accordance with the present invention.

Referring now to FIG. 2, an embodiment of the invention will now be described. Comparing FIG. 2 with FIG. 1 it will be seen that the inverter and pull-up arrangement of FIG. 1 is replaced by a dynamic differential comparator 100. It will also be seen that the circuit includes a time delay 150 connected between the clock node 21 and circuitry of the comparator.

The comparator 100 has a first and a second differentially connected N-type transistor 101, 102 with the first of these transistors 101 having its gate connected to the precharge potential Vcc. The second transistor 102 has its gate connected to the precharge node 4. The sources of the first and second transistors 101, 102 are connected in common and via a switched current source N-type transistor 103 to the reference potential Vss. The drain of the first transistor 101 is connected to a positive supply potential, here Vcc via the main current path of a first P-type transistor 110 and the drain of the second transistor 102 is connected to the positive supply via the main current path of a second P-type transistor 111. The common node between transistor 101 and 110 is connected to the gate of the second P-type transistor 111. The common node between the second N-type transistor 102 and the second P-type transistor 111 is connected to the gate of the first P transistor 110. The gate of the first P-type transistor 110 is connected to the positive supply Vcc via a first P-type control transistor 115 and the gate of the second P-type transistor 111 is connected to the positive supply via a second P-type control transistor 116. The gates of the P-type control transistors 115, 116 are connected together, and connected to the output 151 of the time delay circuit 150, the output 151 of the time delay 150 is also connected to the gate of the switched current source transistor 103.

Further reference to FIG. 2 shows that the inverter 7, having the output node 6 is connected to the common node of the second N transistor 102 and the second P transistor 111.

Although the comparator circuit 100 may be otherwise symmetric, the second N-type transistor 102 has a lower threshold voltage than the first N-type transistor 101.

In use when the clock pulse is at a logic 0 the precharge transistor 20 is conducting and precharges the node 4 to substantially Vcc. In this state the time delay 150 has a low output which has the effect of turning on the control transistor 115 and 116 and turning off the current source transistor 103. Thus, the first and second P transistors 110 and 111 are both turned off because their gates are connected to the positive supply and the source nodes of the comparator transistors 101, 102 are isolated from the reference supply.

At a later time, the clock pulse changes to logic 1 which causes the N transistor 30 to conduct and, according to the logic levels at node 11, 12, 13 the node 4 will either remain at Vcc or will drop in potential.

The time delay 150 is selected to provide an output transition at a time sufficiently later than the transition from precharge to evaluate that the potential at node 4 would have fallen sufficiently to be evaluated (if any fall occurs). At this later time, when the output 151 goes high, the N-type switch current source 103 starts to conduct and the P-type control transistors 115, 116 are turned off. As a result, and due to the second N-type transistor 102 having a lower threshold voltage than the first N-type transistor 101, provided node 4 has not fallen in potential, the second N-type transistor 102 will conduct more strongly than the first N-type transistor 101 with the result that the first P-type transistor 110 will be turned on faster than the second P-type transistor 111. Hence the gate of the second P-type transistor 111 is pulled towards the positive supply, thus turning off the second P-type transistor 111. The input to the inverter 7 will thus be close to Vss which means that the output node 6 will be at logic 1.

If however the precharge node 4 has fallen substantially then the first N-type transistor 101 will conduct more strongly than the second N-type transistor 102 with the opposite effects to those described above. More specifically, the result of transistor 101 turning on harder than transistor 102 is that the second P transistor 111 will turn on more quickly than the first transistor 110 which means that the gate of transistor 110 will be pulled high. The result is that the inverter 7 will receive a logic 1 at its input and the output 6 will be at logic 0.

It will be seen that the comparator 100 is a dynamic device in that there is no path for current flow in the steady state. If transistor 102 is on then transistor 111 is off and if transistor 101, then transistor 110 is off.

The result of this is that the device of FIG. 2 is power efficient.

The device of FIG. 2 has been described in the context of precharge-enable logic circuit. It will be understood by those skilled in the art that other precharge-evaluate logic circuitry could be used instead, and more specifically that there are many other types of precharge evaluate logic circuits which could be used including NAND gates.

The arrangement is primarily suitable for determining whether the node 4 has deviated downwardly from its precharge state. As such, it will be appreciated by those skilled in the art that it could be used to determine the logic state of a transistor in a memory arrangement. If a transistor is provided that is connected to a precharge node such that in one memory state the transistor is off and in the other memory state the transistor is on, then the use of the dynamic differential offset comparator disclosed in FIG. 2, or similar such circuitry, could be used to evaluate the state of the memory cell comprising the transistor. It is therefore possible to dispense with the need for complementary bit lines.

It will be appreciated by those skilled in the art that when the clock pulse 21 goes from the precharge to the evaluate condition there may be some coupling between the gates of the precharge transistor 20 and the precharge node 4. This coupling takes the form of a capacitive coupling and it is possible for the coupling to be manipulated by arranging for the line shown as node 4 to run close to the clock line. In this situation the node 4 can be precharged to above Vcc by use of a bootstrap effect. Given the ability to manipulate the dimensions of the circuit sufficiently, it may be possible to dispense with the need for different threshold voltages for the comparator transistor 101, 102, instead relying upon the additional voltage at node 4 due to this bootstrap effect.

In the described embodiment, the comparator is powered by the positive supply which also provides the precharge voltage. It will be clear to those skilled in the art that this is not in fact essential and that the positive supply to the P-type transistors 110, 111, 115 and 116 could in fact be another positive supply if such were available. The primary feature of the embodiment of FIG. 2 is the fact that the comparator is capable of adopting one state when its two input levels are equal, and another state when a defined one of those two inputs is lower than the other.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of determining whether a potential on a node remains constant, comprising:

providing a differential comparator connected between upper and lower supply lines and having a first input connected to said node, a second input connected to a precharge potential and an output, wherein said first input becomes active at a lower applied potential than the second input, the comparator having a first enabled state in which said output represents a difference between the first and second input potentials and a second disabled state, wherein the comparator has no path for current flow between said supply lines in said enabled and disabled states;

connecting the node to said precharge potential whereby said node is precharged, while maintaining the disabled state;

disconnecting the node from said precharge potential; and after a time delay, causing said comparator to switch to the enabled state, whereby said output indicates whether the node potential remains constant.

2. A circuit responsive to deviation of a node from a precharge potential after a precharge supply is disconnected from said node, the circuit comprising:

a dynamic comparator having first and second transistors with a first conductivity and being differentially connected to each other, the first transistor having a gate connected to said node and the second transistor having a gate connected to the precharge potential, and wherein the first transistor has a lower threshold voltage than the second transistor;

a load circuit connected between a positive supply node and respective first conduction terminals of the first and second transistors, the load circuit comprising a pair of cross-coupled load transistors with a second conductivity, said second conductivity being complementary to the first conductivity; and a current source transistor of the first conductivity type connected between respective second conduction terminals of the first and second transistors and a reference potential.

3. The circuit of claim 2 further comprising a pair of disable transistors connected between said positive supply node and gates of the load transistors, the disable transistors having gates connected to a control electrode of the current source transistor.

4. The circuit of claim 3 further comprising precharge circuitry for applying said precharge potential to said node, said precharge circuitry having a clock node for activation thereof in response to a first clock level, said precharge circuitry being responsive to a second clock level to terminate application of said precharge potential, the circuit further comprising a time delay circuit receiving said clock pulse and providing an enable output to said disable transistors and said current source transistor at a predetermined time after termination of said precharge potential.

5. A circuit responsive to deviation of a node from a precharge potential, the circuit comprising:

a dynamic comparator having differentially-connected first and second transistors each with control, first conduction, and second conduction terminals, the control terminal of the first transistor being connected to the node, the control terminal of the second transistor being connected to a reference voltage, and the second conduction terminals being connected to each other;

a load circuit having cross-coupled first and second load transistors each with control, first conduction, and second conduction terminals, the first conduction terminals of the load transistors being connected to each other, the second conduction terminal of the first load transistor being connected to the first conduction terminal of the first transistor and to the control terminal of the second load transistor, and the second conduction terminal of the second load transistor being connected to the first conduction terminal of the second transistor and to the control terminal of the first load transistor;

first and second disable transistors connected respectively between a positive supply voltage and the control terminals of the first and second load transistors, the positive supply voltage also being coupled to the first conduction terminals of the first and second load transistors;

precharge circuitry having an input that receives a clock signal and an output that applies the precharge potential to the node when the clock signal is at a first clock level and terminates application of the precharge potential to the node when the clock signal is at a second clock level; and a time delay circuit connected between the input of the precharge circuitry and respective control terminals of the disable transistor, the time delay circuit being structured to activate the disable transistors when the clock signal is at the first clock level and deactivate the disable transistors at a predetermined time after the clock signal switches to the second clock level.

6. The circuit of claim 5, further comprising an output terminal connected to the first conduction terminal of the first transistor.

7. The circuit of claim 6, further comprising an inverter connected between the output terminal and the first conduction terminal of the first transistor.

8. The circuit of claim 5 wherein the first conduction terminals of the load transistors are connected to a positive supply voltage equal to the reference voltage.

9. The circuit of claim 5, further comprising a current source transistor connected between a ground voltage and the second conduction terminals of the first and second transistors, the current source transistor having a control terminal connected to the time delay circuit such that the current source transistor is activated when the disable transistors are deactivated.

10. The circuit of claim 5, further comprising discharge circuitry that includes first and second discharge transistors coupled between the precharged node and a ground voltage, the first discharge transistor having a control terminal coupled to the input of the precharge circuitry such that the first discharge transistor is activated by the clock signal when the clock signal is at the second clock level.

11. The circuit of claim 5 wherein the first and second transistors are of a first conductivity type and the first and second load transistors are of a second conductivity type that is complementary to the first conductivity type.

12. The circuit of claim 5 wherein the first transistor has a lower threshold voltage than the second transistor.

13. A circuit responsive to deviation of a node from a precharge potential after a precharge supply is disconnected from said node, the circuit comprising:

a dynamic comparator having first and second transistors with a first conductivity and being differentially connected to each other, the first transistor having a gate connected to said node and the second transistor having a gate connected to the precharge potential, and wherein the first transistor has a lower threshold voltage than the second transistor;

a load circuit connected between a positive supply node and respective first conduction terminals of the first and second transistors, the load circuit comprising a pair of cross-coupled load transistors with a second conductivity, said second conductivity being complementary to the first conductivity;

a current source transistor of the first conductivity type connected between respective second conduction terminals of the first and second transistors and a reference potential;

a pair of disable transistors connected between said positive supply node and gates of the load transistors, the disable transistors having gates connected to a control electrode of the current source transistor; and precharge circuitry to apply said precharge potential to said node, said precharge circuitry having a clock node for activation thereof in response to a first clock level, said precharge circuitry being responsive to a second clock level to terminate application of said precharge potential, the circuit further comprising a time delay circuit to receive said clock pulse and to provide an enable output to said disable transistors and said current source transistor at a predetermined time after termination of said precharge potential.

* * * * *